(12) United States Patent
Van Bommel et al.

(10) Patent No.: US 12,104,785 B2
(45) Date of Patent: Oct. 1, 2024

(54) LASER-PHOSPHOR LIGHT SOURCE WITH IMPROVED BRIGHTNESS AND THERMAL MANAGEMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/030,014

(22) PCT Filed: Oct. 4, 2021

(86) PCT No.: PCT/EP2021/077225
§ 371 (c)(1),
(2) Date: Apr. 3, 2023

(87) PCT Pub. No.: WO2022/073895
PCT Pub. Date: Apr. 14, 2022

(65) Prior Publication Data
US 2023/0375157 A1 Nov. 23, 2023

(30) Foreign Application Priority Data
Oct. 8, 2020 (EP) ..................................... 20200837

(51) Int. Cl.
*F21V 9/30* (2018.01)
*F21V 7/22* (2018.01)
(Continued)

(52) U.S. Cl.
CPC .................. *F21V 9/30* (2018.02); *F21V 7/22* (2013.01); *F21V 29/70* (2015.01); *H04N 9/3144* (2013.01);
(Continued)

(58) Field of Classification Search
CPC ... F21V 9/30; F21V 7/22; F21V 29/70; H04N 9/3161
See application file for complete search history.

(56) References Cited

U.S. PATENT DOCUMENTS 8,096,668 B2 * 1/2012 Abu-Ageel ............ H04N 9/315
362/296.01
8,662,672 B2 * 3/2014 Hikmet ................ H04N 9/3129
353/31

(Continued)

*Primary Examiner* — Evan P Dzierzynski

(57) ABSTRACT

The invention provides a light generating system (1000) comprising a light generating device (100), a luminescent body (200), and first optics (410), wherein: •the light generating device (100) is configured to generate device light (101); wherein the light generating device (100) comprises a laser; •the luminescent body (200) comprises a luminescent material (210), wherein the luminescent material (210) is configured to convert at least part of the device light (101) into luminescent material light (211), and wherein the luminescent body (200) is transmissive for at least part of the luminescent material light (211); •the first optics (410) are transmissive for at least part of the device light (101) and reflective for at least part of the luminescent material light (211), wherein the first optics (410) comprise a primary optic surface (411) having a first surface area A1, wherein the primary optic surface (411) is configured in a light receiving relationship with the light generating device (100); •the luminescent body (200) is enclosed by a cavity (500) having a cavity opening (510) having a smallest cross-sectional area A2, wherein the cavity (500) is at least partly defined by the optics (410); wherein the first optics (410) comprises the cavity opening (510); wherein A2<A1; and •the cavity (500) being reflective for the luminescent material light (211) and the luminescent material light (211) substantially only exiting the cavity (500) via the cavity opening (510).

15 Claims, 4 Drawing Sheets

(51) Int. Cl.
*F21V 29/70* (2015.01)
*H04N 9/31* (2006.01)

(52) U.S. Cl.
CPC ......... *H04N 9/3152* (2013.01); *H04N 9/3161* (2013.01)

(56) References Cited

U.S. PATENT DOCUMENTS

| | | | |
|---|---|---|---|
| 9,995,459 B2* | 6/2018 | Sun | F21V 9/32 |
| 2008/0117500 A1* | 5/2008 | Narendran | H01L 33/507 |
| | | | 257/E33.059 |
| 2010/0202129 A1 | 8/2010 | Abu-Ageel | |
| 2012/0104934 A1 | 5/2012 | Fukai et al. | |
| 2012/0140504 A1* | 6/2012 | Fukai | F21S 41/16 |
| | | | 362/516 |
| 2014/0022512 A1* | 1/2014 | Li | G02B 6/29337 |
| | | | 353/31 |
| 2016/0026076 A1 | 1/2016 | Hu | |
| 2018/0066810 A1 | 3/2018 | Lentine et al. | |
| 2019/0101258 A1* | 4/2019 | Wang | B60Q 1/0076 |
| 2019/0179218 A1 | 6/2019 | Jagt et al. | |
| 2021/0148547 A1* | 5/2021 | Okuno | F21V 3/02 |

* cited by examiner

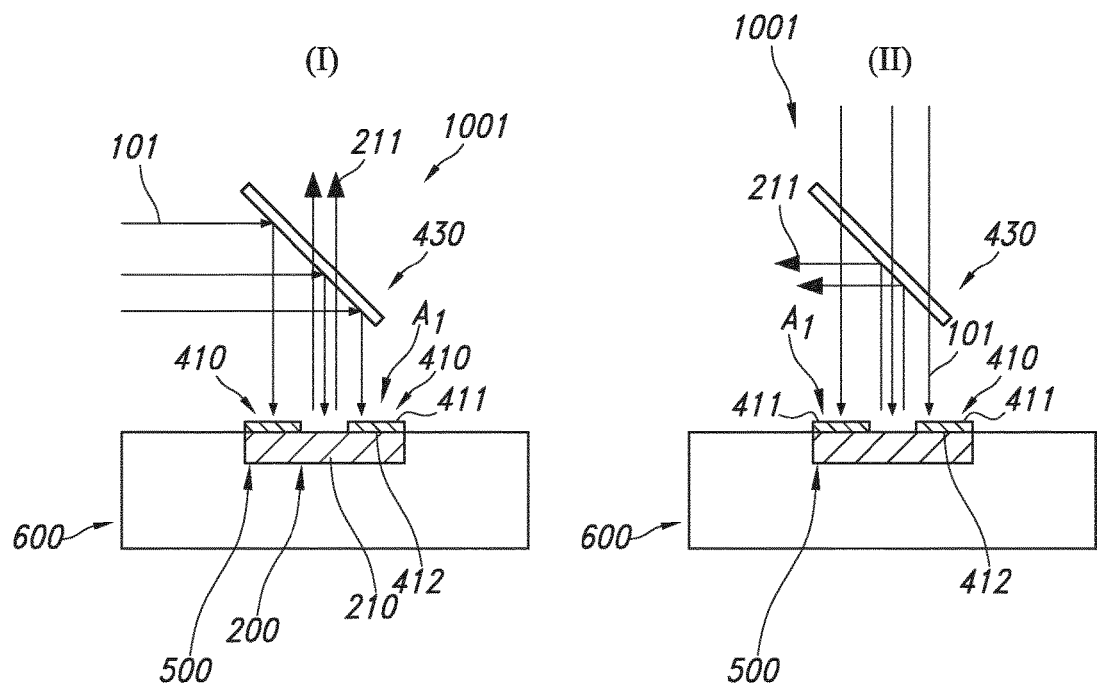
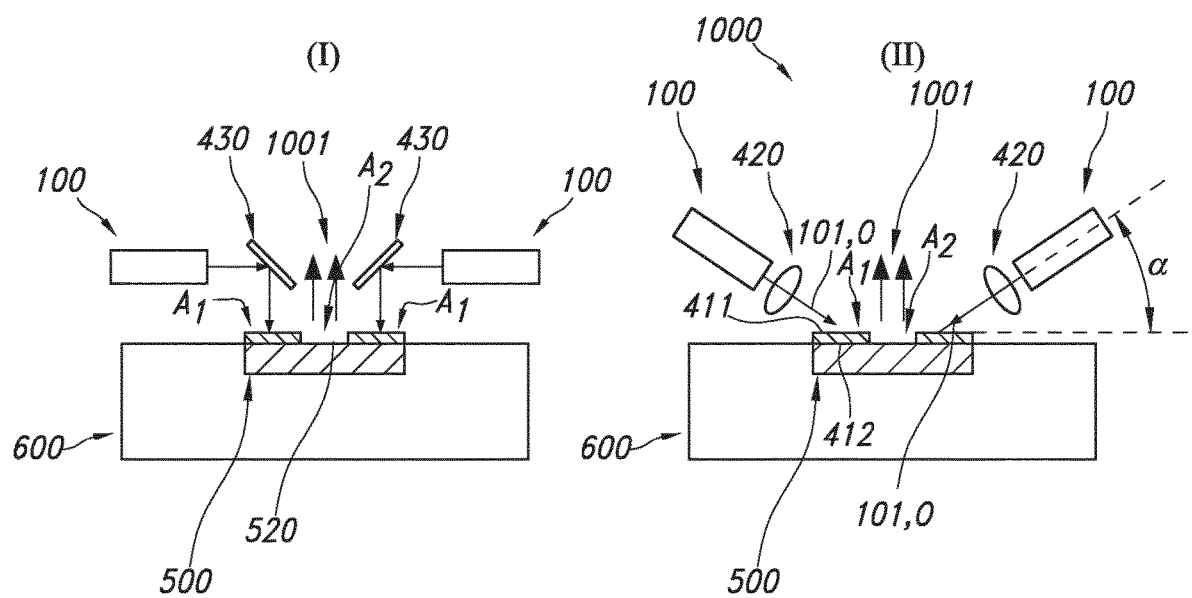
FIG. 2A
FIG. 2B

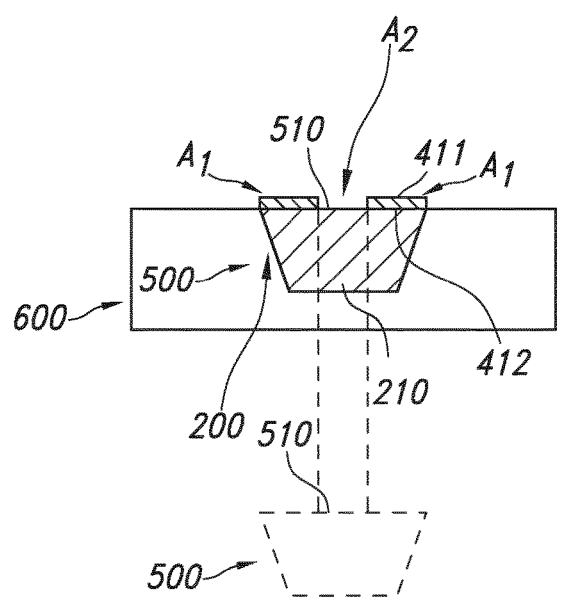
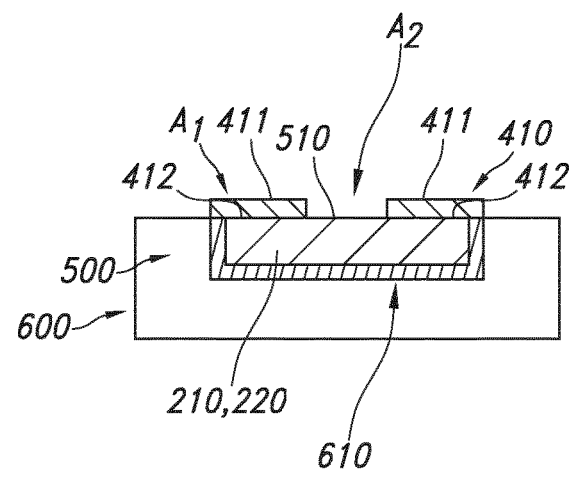
FIG. 2C
FIG. 2D
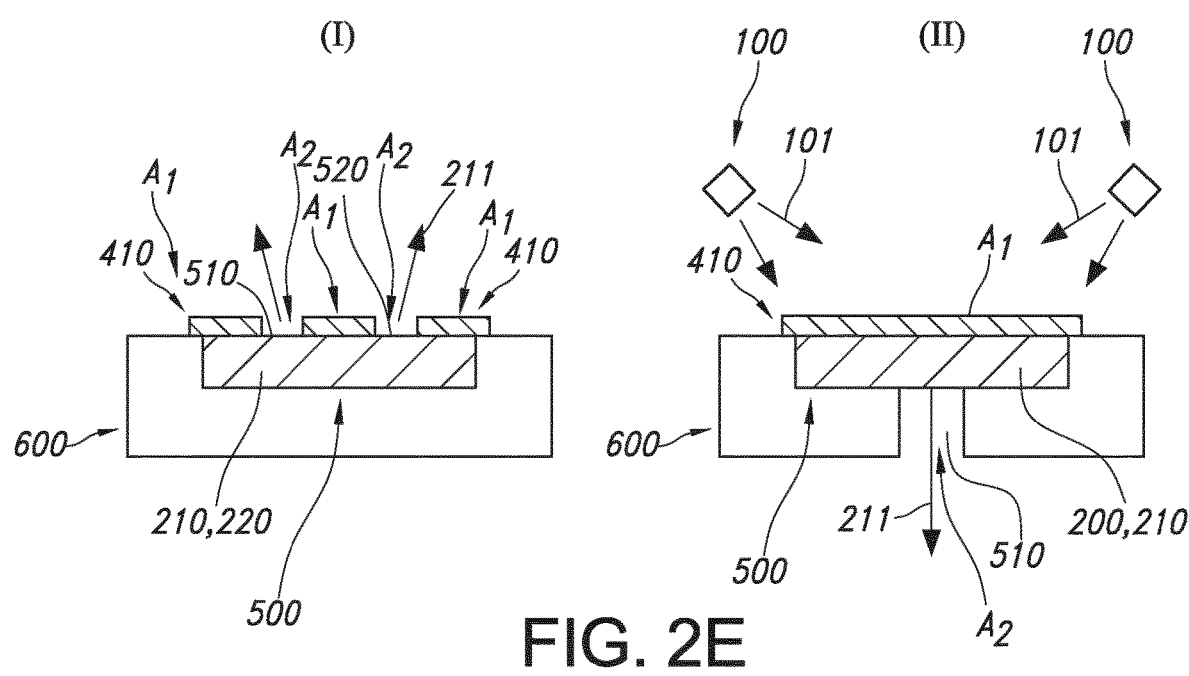
FIG. 2E

LASER-PHOSPHOR LIGHT SOURCE WITH IMPROVED BRIGHTNESS AND THERMAL MANAGEMENT

CROSS-REFERENCE TO PRIOR APPLICATIONS

This application is the U.S. National Phase application under 35 U.S.C. § 371 of International Application No. PCT/EP2021/077225, filed on Oct. 4, 2021, which claims the benefit of European Patent Application No. 20200837.1, filed on Oct. 8, 2020. These applications are hereby incorporated by reference herein.

FIELD OF THE INVENTION

The invention relates to a light generating system as well as to a light generating device comprising such light generating system.

BACKGROUND OF THE INVENTION

Light apparatuses including a light source generating a blue-colored light, a phosphorus filter transforming the blue-colored light into white light, are known in the art. US2018066810, for instance, describes light apparatuses including a light source generating a blue-colored light, a phosphorus filter transforming the blue-colored light into white light, and a light dispersing element receiving the light and projecting a plurality of discrete points of light onto a target surface that have been transformed into white light by the phosphorus filter. US2018066810 also describes methods for creating a plurality of discrete points of light on a target surface using a light apparatus including a light source and a phosphorus filter and a light dispersing element, including generating a light using the light source, in which the generated light is blue-colored light, transforming the light into white light by passing the light through a phosphorus filter, and causing the light to be incident on the light dispersing element, such that the light dispersing element disperses the light and creates a plurality of individual points of light on the target surface.

US2010/202129A1 discloses an illumination system with a wavelength conversion material and an omni-directional reflector that is utilized to enhance the optical efficiency of the illumination system with a single aperture for inputting and outputting light beams. Light guides with restricted output apertures, micro-element plates and optical elements are utilized to enhance the brightness of delivered light through light recycling. Furthermore, micro-element plates may be used to provide control over the spatial distribution of light in terms of intensity and angle. Efficient and compact illumination systems that utilize single light source with deflectors are also disclosed.

US2019/179218A1 discloses a light emitting device comprising a luminescent element comprising a first face and a second face, the first face comprising a light input surface and a light exit surface. The luminescent element receives first light with a first spectral distribution emitted by at least one laser light source at the light input surface, converting at least a part of the first light with the first spectral distribution to second light with a second spectral distribution, guiding the second light with the second spectral distribution to the light exit surface and coupling at least a part of the second light with the second spectral distribution out of the light exit surface. A heat sink element is arranged to be in thermal contact with at least a part of the luminescent element.

US2021/104934A1 discloses a phosphor-based lamp includes a phosphor material and a laser to excite the phosphor material. The lamp includes a recycling collar to reflect and recycle high angle light to increase brightness. A beam splitter redirects the laser beam to direct the laser beam through the recycling collar aperture onto the phosphor material. Light emitted by the phosphor material which exits the aperture passes through the beam splitter as the output of the lamp.

SUMMARY OF THE INVENTION

While white LED sources can give an intensity of e.g. up to about 300 lm/mm$^2$; static phosphor converted laser white sources can give an intensity even up to about 20.000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. Assuming e.g. a reflective mode operation, blue laser light may be incident on a phosphor. This may in embodiments realize almost full conversion of blue light, leading to emission of converted light. It is for this reason that the use of garnet phosphors with relatively high stability and thermal conductivity is suggested. However, also other phosphors may be applied. Heat management may remain an issue when extremely high-power densities are used.

High brightness light sources can be used in applications such as projection, stage-lighting, spot-lighting and automotive lighting. For this purpose, laser-phosphor technology can be used wherein a laser provides laser light and e.g. a (remote) phosphor converts laser light into converted light. The phosphor may in embodiments be arranged on or inserted in a heatsink for improved thermal management and thus higher brightness.

One of the problems that may be associated with such (laser) light sources is the heat management of the (ceramic) phosphor. Other problems associated with such laser light sources may be the desire to create compact high power devices.

Hence, it is an aspect of the invention to provide an alternative luminescent element, which preferably further at least partly obviates one or more of above-described drawbacks. The present invention may have as object to overcome or ameliorate at least one of the disadvantages of the prior art, or to provide a useful alternative.

In a first aspect, the invention provides a light generating system ("system") comprising a light generating device ("device"), a luminescent body ("body"), and first optics. Especially, in embodiments the light generating device may be configured to generate device light. In specific embodiments, the light generating device comprises a laser. Further, in embodiments the luminescent body may comprise a luminescent material. Especially, in embodiments the luminescent material is configured to convert at least part of the device light into luminescent material light. Further, in specific embodiments the luminescent body may be transmissive for at least part of the luminescent material light. Further, in embodiments the first optics may be transmissive for at least part of the device light and may be reflective for at least part of the luminescent material light. Especially, in embodiments the first optics comprise a primary optic surface having a first surface area (A1). Further, in embodiments the primary optic surface is especially configured in a light receiving relationship with the light generating device. Yet further, in embodiments the luminescent body may be enclosed by a cavity, especially a reflective cavity, having a cavity opening. The cavity opening may in embodiments have a smallest cross-sectional area (A2). Especially, in embodiments the cavity may be at least partly defined by the optics. In specific embodiments, A2<A1. Therefore, in specific embodiments the invention provides a light generating system comprising a light generating device, a luminescent body, and first optics, wherein: (a) the light generating device is configured to generate device light; wherein the light generating device comprises a laser; (b) the luminescent body comprises a luminescent material, wherein the luminescent material is configured to convert at least part of the device light into luminescent material light, and wherein the luminescent body is transmissive for at least part of the luminescent material light; (c) the first optics are transmissive for at least part of the device light and reflective for at least part of the luminescent material light, wherein the first optics comprise a primary optic surface having a first surface area (A1), wherein the primary optic surface is configured in a light receiving relationship with the light generating device; and (d) the luminescent body is enclosed by a cavity having a cavity opening having a smallest cross-sectional area (A2), wherein the cavity is at least partly defined by the optics; and wherein A2<A1.

With such system, it may be possible to irradiate a relatively large area of the luminescent body whereas luminescence may escape from a relatively small area. Further, efficiency may be relatively high as a large area may be in thermal contact with a thermally conductive material, such as a heatsink. Further, a relatively small device may be provided which may be able to provide light with a relatively high intensity.

In embodiments, the light generating device is especially configured to generate device light. The light generating device may comprise a light source, such as a solid state light source, configured to generate the device light, optionally based on conversion with a luminescent material. The light generating device comprises a laser, such as a solid state laser. Hence, the device light comprises laser light; in yet further specific embodiments the device light may be laser light.

The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module.

The light source has a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes form the light exit surface of the light source.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation.

Especially, in embodiments the term "laser" may refer to a solid-state laser. In specific embodiments, the terms "laser" or "laser light source", or similar terms, refer to a laser diode (or diode laser).

Hence, in embodiments the light source comprises a laser light source. In embodiments, the terms "laser" or "solid state laser" may refer to one or more of cerium doped lithium strontium (or calcium) aluminum fluoride (Ce: LiSAF, Ce:LiCAF), chromium doped chrysoberyl (alexandrite) laser, chromium ZnSe (Cr:ZnSe) laser, divalent samarium doped calcium fluoride (Sm:$CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate Nd:$YCa_4O(BO_3)_3$ or Nd:YCOB, neodymium doped yttrium orthovanadate (Nd:$YVO_4$) laser, neodymium glass (Nd:glass) laser, neodymium YLF (Nd: YLF) solid-state laser, promethium 147 doped phosphate glass (147$Pm^{3+}$:glass) solid-state laser, ruby laser ($Al_2O_3$: $Cr^{3+}$), thulium YAG (Tm:YAG) laser, titanium sapphire (Ti:sapphire; $Al_2O_3$:$Ti^{3+}$) laser, trivalent uranium doped calcium fluoride (U:$CaF_2$) solid-state laser, Ytterbium doped glass laser (rod, plate/chip, and fiber), Ytterbium YAG (Yb:YAG) laser, $Yb_2O_3$ (glass or ceramics) laser, etc.

In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heatsinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

As indicated above, the light generating device may comprise one or more light sources. Further, as indicated above, the light generating device may especially comprise a laser or be a laser. Therefore, the light generating device is especially configured to generate (polarized) laser radiation.

The luminescent body may have any shape. In general, however, the luminescent body may comprise two essentially parallel faces, defining a height (of the luminescent body). Further, the luminescent body may comprise an edge face, bridging the two essentially parallel faces. The edge face may be curved in one or two dimensions. The edge face may be planar. The luminescent body may have a rectangular or circular cross-section, though other cross-sections may also be possible.

In embodiments, the body has lateral dimensions width or length (W1 or L1) or diameter (D) and a thickness or height (H1). In embodiments, (i) D≥H1 or (ii) and W1≥H1 and/or L1≥H1. The luminescent tile may be transparent or light scattering. In embodiments, the tile may comprise a ceramic luminescent material. In specific embodiments, L1≤10 mm, such as especially L1≤5 mm, more especially L1≤3 mm, most especially L1≤2 mm. In specific embodiments, W1≤10 mm, such as especially W1≤5 mm, more especially W1≤3 mm, most especially W1≤2 mm. In specific embodiments, H1≤10 mm, such as especially H1≤5 mm, more especially H1≤3 mm, most especially H1≤2 mm. In specific embodiments, D≤10 mm, such as especially D≤5 mm, more especially D≤3 mm, most especially D≤2 mm. In specific embodiments, the body may have in embodiments a thickness in the range 50 μm-1 mm. Further, the body may have lateral dimensions (width/diameter) in the range 100 μm-10 mm. In yet further specific embodiments, (i) D>H1 or (ii) W1>H1 and W1>H1. Especially, the lateral dimensions like length, width, and diameter are at least 2 times, like at least 5 times, larger than the height. In specific embodiments, the luminescent body has a first length L1, a first height H1, and a first width W1, wherein H1≤0.5*L1 and H1≤0.5*W1.

Further, as indicated above, the luminescent body may comprise a luminescent material. For instance, in embodiments the luminescent body may be a crystalline body, or a ceramic body, or a luminescent material dispersed in another material, like e.g. a polymeric body (see further also below). Especially, the luminescent material may be configured to convert at least part of the device light into luminescent material light.

In embodiments, essentially all device light received by the luminescent body may be absorbed by the luminescent body. At least part of the absorbed light is converted into luminescent material (especially dependent upon the quantum efficiency). This may be indicated as full conversion.

In other embodiments, part of the device light may be reflected and/or transmitted. The reflected or transmitted light may be comprised in the system light. This may be indicated as partial conversion.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise up-converter luminescent material, i.e. radiation of a larger wavelength is converted into radiation with a smaller wavelength ($\lambda_{ex}>\lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. Examples of possible luminescent materials are indicated below.

In embodiments, luminescent materials are selected from garnets and nitrides, especially doped with trivalent cerium or divalent europium, respectively. The term "nitride" may also refer to oxynitride or nitridosilicate, etc.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3\leq 0.2$, wherein $y1+y2=1$, wherein $0<y2\leq 0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3<0.1$, and wherein $0<y2<0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3A_{15}O_{12}$, wherein $x1+x3=1$, and wherein $0<x3\leq 0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3\leq 0.2$, wherein $y1+y2=1$, wherein $0<y2\leq 0.2$. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

In embodiments, the luminescent material may alternatively or additionally comprise one or more of $M_2Si_5N_8$: $Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. In embodiments, the luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in CaAlSiN$_3$:Eu, the correct formula could be $(Ca_{0.98}Eu_{0.02})AlSiN^3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca). Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in CaAlSiN$_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO ($Y_2SiO_5$: $Ce^{3+}$), or similar compounds, or BAM ($BaMgAl_{10}O_{17}$: $Eu^{2+}$), or similar compounds.

The term "luminescent material" herein especially relates to inorganic luminescent materials.

Instead of the term "luminescent material" also the term "phosphor". These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

The (inorganic) luminescent material may in embodiments be provided as single crystal, or as ceramic body, or a luminescent material dispersed in another material, like polymeric material (of a polymeric body). Organic luminescent materials and/or quantum dots may also be dispersed in another material, like polymeric material (of a polymeric body).

The luminescent body is especially configured to receive at least part of the device light. Hence, in embodiments the luminescent body is configured downstream of the light generating device. Further, the luminescent body may especially be configured in a light receiving relationship with the light generating device.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material.

The luminescent body is transmissive for at least part of the luminescent material light. As the luminescent body may be transmissive, luminescent material light generated at a position away from the cavity opening (see below) may propagate to the cavity opening, optionally after one or more reflections, and escape from the cavity via the cavity opening.

In specific embodiments, a material may be considered transmissive when the transmission of the radiation at a wavelength or in a wavelength range, especially at a wavelength or in a wavelength range of radiation generated by a source of radiation as herein described, through a 1 mm thick layer of the material, especially even through a 5 mm thick layer of the material, under perpendicular irradiation with said radiation is at least about 20%, such as at least 40%, like at least 60%, such as especially at least 80%, such as at least about 85%, such as even at least about 90%.

The light transmissive material may have light guiding or wave guiding properties. Hence, the light transmissive material is herein also indicated as waveguide material or light guide material. The light transmissive material will in general have (some) transmission of one or more of (N)UV, visible and (N)IR radiation, such as in embodiments at least visible light, in a direction perpendicular to the length of the light transmissive material. In embodiments, without the activator (dopant), such as trivalent cerium, the internal transmission in the visible might be close to 100%.

The transmission of the light transmissive material (as such) for one or more luminescence wavelengths may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive material, under perpendicular irradiation of radiation having a selected luminescence wavelength (such as a wavelength corresponding to an emission maximum of the luminescence of the luminescent material of the light transmissive material), will have a transmission of at least 95%.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent body, such as to suppress Fresnel reflection losses (during the light incoupling process).

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction.

In embodiments, the element comprising the light transmissive material may essentially consist of the light transmissive material. In specific embodiments, the element comprising the light transmissive material may be a light transparent element.

Especially, the light transmissive element, such as the light transparent element, may in embodiments have an absorption length and/or a scatter length of at least the length (or thickness) of the light transmissive element, such as at least twice the length of the light transmissive element. The absorption length may be defined as the length over which the intensity of the light along a propagation direction due to absorption drops with 1/e. Likewise, the scatter length may be defined as the length along a propagation direction along which light is lost due to scattering and drops thereby with a factor 1/e. Here, the length may thus especially refer to the distance between a first face and a second face of the light transmissive element, with the light transmissive material configured between the first face and second face.

Hence, in embodiments it may apply that when the luminescent body is irradiated with the device light perpendicular to the luminescent body, part of the device light may be transmitted when propagating parallel to the height of the luminescent body (such as at least about 30% (relative to the power of the device light)). Further, in embodiments would the luminescent body be irradiated with the light having a wavelength essentially the same as the centroid wavelength of the luminescent material light perpendicular to the luminescent body, part of the light may be transmitted when propagating parallel to the height of the luminescent body (such as at least about 50% (relative to the power of the light)). Further, in embodiments would the luminescent body be irradiated with the light having a wavelength essentially the same as the centroid wavelength of the luminescent material light perpendicular to the luminescent body, part of the light may be transmitted when propagating parallel to a length of the luminescent body (such as at least about 30% (relative to the power of the light)).

The term "centroid wavelength", also indicated as λc, is known in the art, and refers to the wavelength value where half of the light energy is at shorter and half the energy is at longer wavelengths; the value is stated in nanometers (nm). It is the wavelength that divides the integral of a spectral power distribution into two equal parts as expressed by the formula $\lambda c = \Sigma \lambda * I(\lambda) / (\Sigma I(\lambda))$ where the summation is over the wavelength range of interest, and $I(\lambda)$ is the spectral energy density (i.e. the integration of the product of the wavelength and the intensity over the emission band normalized to the integrated intensity). The centroid wavelength may e.g. be determined at operation conditions.

The system may further comprise first optics. The first optics are transmissive for at least part of the device light and reflective for at least part of the luminescent material light.

The first optics allow a larg(er) part the luminescent body to be irradiated with excitation radiation, while the cavity with cavity opening may essentially force the luminescent material light to only escape from the luminescent body (and the cavity) via the cavity opening. In this way, a relative larger area may be excited, a relative larger area may be cooled, and a concentrated emission may be obtained.

Further, the first optics define part of the cavity. For that reason, it appears desirable that the first optics is reflective for the luminescent material light. In this way excitation light may be transmitted into the cavity, while luminescent material light stays within the cavity (unless it escapes via the cavity opening).

For instance, in embodiments under radiation with the device light, at least 40%, such as at least 50%, even more especially at least 70%, like yet even more especially at least 80%, such as at least 90% of the power ("optical power") of the device light that irradiates the first optics may be transmitted. In embodiments, the first optics may be optimized to receive the device radiation perpendicularly or under an angle.

Herein, the term "power" may thus also refer to "optical power".

For instance, in embodiments under perpendicular radiation with the luminescent material light, at least 40%, such as at least 50%, even more especially at least 60%, like yet even more especially at least 65%, such as at least 70% of the power of the luminescent material light that irradiates the first optics may be reflected. Note that the luminescent material light may irradiate the first optics under different angles. However, here for the sake of comparability, the perpendicular radiation is chosen.

The first optics comprise a primary optic surface having a first surface area (A1), wherein the primary optic surface is configured in a light receiving relationship with the light generating device. Hence, at least part of the optic surface may be irradiated by the device light. The first optics may also comprise a secondary optic surface which may be directed to the luminescent body. As the luminescent body during operation of the system may provide luminescent material light, the secondary optic surface may be configured in a light receiving relationship with the luminescent body.

As indicated above, in embodiments the luminescent body is enclosed by a cavity. Especially, this cavity is a reflective cavity for the luminescent material light. Hence, luminescent material light escaping from the luminescent body may be reflected by the cavity wall back into the luminescent body. In this way, a kind of internal reflection may be created, where luminescent material light may essentially only escape from the cavity via the cavity opening. Especially at least 50% of the luminescent material light that escapes from the cavity, escapes via the cavity opening. Here, the percentage is relative to the power of that luminescent material light that escapes. Hence, the luminescent body, cavity, and cavity opening may be configured such that especially at least 40%, such as even more especially at least 50% of the luminescent material light that escapes from the cavity, escapes via the cavity opening, especially at least 60%, even more especially at least 70%, like even more especially at least 80%. Hence, at least 50% of the luminescent material light that escapes from the cavity, escapes via the smallest cross-sectional area (A2) of the cavity opening. Here, percentage refer to the percentage of the optical power of all luminescent material that escapes from the cavity.

Note that at least part of the cavity (or the cavity wall) may be defined by the first optics. The cavity may be defined by a (reflective) wall, reflective for the luminescent material light. Up to about, such as in the range of 10-60%, like 25-50% of the area of the wall may be defined by the first optics (i.e. the secondary face thereof).

In embodiments, the cavity may also be a reflective cavity for the device light.

The cavity has a cavity opening. The cavity opening has a smallest cross-sectional area (A2). The cavity opening may have constant cross-section shape and size, like e.g. a cylindrically shaped cavity opening. however, the cavity opening may also have a cross-sectional size that changes over the cavity length, like a conical cavity opening. Hence, the smallest cross-section area is herein chosen. The length of the cavity opening may in embodiments be smaller than a circular equivalent diameter of the smallest cross-sectional area.

In embodiments, the cavity opening may have a circular or polygonal with more than four sides, such as at least 6 sides (hexagonal), cross-sectional shape. This may especially be useful for lighting applications.

In embodiments, the cavity opening may have a square or rectangular cross-sectional shape. This may especially be useful for projection applications.

In embodiments, the first optics and the cavity opening may essentially have the same shape, like selected from round, square, rectangular, hexagonal, etc.

The equivalent circular diameter (or ECD) of an (irregularly shaped) two-dimensional shape is the diameter of a circle of equivalent area. For instance, the equivalent circular diameter of a square with side a is $2*a*SQRT(1/\pi)$. For a circle, the diameter is the same as the equivalent circular diameter. Would a circle in an xy-plane with a diameter D be distorted to any other shape (in the xy-plane), without changing the area size, than the equivalent circular diameter of that shape would be D.

Hence, as indicated above, the cavity is at least partly defined by the first optics. Further, in embodiments A2<A1. Hence, the smallest cross-sectional area of the cavity opening is smaller than the area of the primary face of the first optics.

As can be derived from the above, the cavity opening may have any cross-sectional shape. Especially, the cross-sectional shape may be round or rectangular, but may in embodiments also be ring-shaped, etc. Further, the term "cavity opening" may also refer to a plurality of cavity openings. For instance, in embodiments there may be a cavity opening in one side of the cavity and in an opposite side of the cavity. For instance, in embodiments a grid of cavity openings may be provided. For the cumulative cross-sectional areas A2 applies that A2<A1. Hence, when there are two or more cavity openings, A2 refers to the accumulated smallest cross-sectional area of the cavity openings. Hence, the area from which luminescent material light may escape from the cavity is (in general) smaller than the light receiving area of the first optics.

In specific embodiments $0.05 \leq A2/A1 \leq 0.3$. A too small ratio may lead to loss of luminescent material light and a too large ratio may not give a relatively intense spot. Hence, with the herein indicated ranges a high brightness and a good efficiency may be obtained.

As indicated above, the cavity is at least partly be defined by the first optics. Further, the cavity may be defined by a reflector or a reflective thermally conductive element, like e.g. a heatsink. Hence, the cavity opening may be comprised by the first optics or by e.g. the thermally conductive element. In specific embodiments, there is a single cavity opening, which may be comprised by the first optics. In alternative embodiments, there may be a plurality of cavity openings, all comprised by the first optics. The first optics comprises the cavity opening. Note that the first surface area of the first optics is defined by the area of the optics (and not including the area of the cavity opening). Hence, e.g. assuming a dichroic mirror as first optics (see embodiments below), the area of the dichroic mirror is not defined by the cavity opening in such dichroic mirror. Hence, assuming e.g. a round first optics, defined by an outer circle with a third area A3, and a (cylindrical) cavity opening (in the first optics) with an area A2, the area of the first optics is A1=A3−A2.

Note that the cavity opening may in general in embodiments be a physical opening, and may in specific other embodiments be an essentially transparent material like glass or quartz or a ceramic. Hence, the cavity opening as such may have a transmission for the luminescent material light (or for the device light) of at least about 98%, such as at least about 99%, such as 100% (in the case of a physical opening).

As indicated above, the first optics may in embodiments be used to enable a relative large area where the luminescent body may be irradiated with device light, while luminescent material light may not easily escape via the first optics. Hence, especially a substantial part of the first optics may be irradiated with the device light. This may further facilitate thermal management. For instance, a focused laser spot may also provide an intense emission spot, but may locally heat the luminescent material substantially. In the present invention, however, the excitation light may be distributed over the luminescent body, while still an intense emission spot may be provided. This may lead to a lower heating up of the luminescent material, which may be beneficial for the efficiency and/or life time (of the luminescent body and/or luminescent material).

Hence, the device light may in embodiments be spread out over at least part of the first optics, or even over a substantial part thereof. This may be achieved with e.g. a beam that is diverging, either by nature of the light generating device or by using optics, or by using a plurality of light generating devices, or combinations of two or more of these, etc., known to a person skilled in the art. Optics to influence the beam shape of the light generating device may herein also be indicated as second optics.

Hence, in embodiments the light generating device and optional second optics may configured to irradiate at least 25%, such as at least 30%, like at least 40% of the first surface area (A1) with the device light. Even more especially, embodiments the light generating device and optional second optics may configured to irradiate at least 50% of the first surface area (A1) with the device light, such as at least 60%, or even at least 70% of the first surface area (A1) with the device light.

In embodiments, at least 30%, such as at least 40% of the device light that reaches the luminescent body may be transmitted by the first optics. Here, percentage may again refer to percentages of the total power of the device light that reaches the luminescent body. Especially, at least 50%, such as at least 60% of the device light that reaches the luminescent body may be transmitted by the first optics, like in specific embodiments at least 70%. In embodiments, even at least 80%, such as at least 90% of the device light that reaches the luminescent body may be transmitted by the first optics, like at least about 95%.

In embodiments, up to about 70%, such as up to about 60%, of the device light that reaches the luminescent body may reach the luminescent body via the cavity opening. This may in embodiments be the case when the first optics comprise the cavity opening. Especially, in embodiments up to about 50%, such as up to about 40%, of the device light that reaches the luminescent body may reach the luminescent body via the cavity opening, like up to about 30%. In specific embodiments, in the range of 5-40% of the device light that reaches the luminescent body may reach the luminescent body via the cavity opening. Hence, at maximum 70% of the optical power, such as at maximum 40% of the optical power of the device light that reaches the luminescent body may reach the luminescent body via the cavity opening. The other part may reach the luminescent body via the first optics.

Hence, in specific embodiments the light generating system may be configured such that at least 50%, such as especially at least 60% of the device light entering the luminescent body enters the luminescent body after transmission through the first optics.

As indicated above, the cavity may especially be a reflective cavity for the luminescent material light, allowing escape from the luminescent material from the cavity substantially only via the cavity opening. To this end, cavity may comprise a cavity wall that is reflective for the luminescent material light (see also above).

In embodiments, at least part of the cavity may be provided by a thermally conductive element (comprising a thermally conductive material) that is reflective, and/or by a reflector on such thermally conductive element (comprising a thermally conductive material).

A thermally conductive element especially comprise thermally conductive material. A thermally conductive material may especially have a thermal conductivity of at least about 20 W/m/K, like at least about 30 W/m/K, such as at least about 100 W/m/K, like especially at least about 200 W/m/K. In yet further specific embodiments, a thermally conductive material may especially have a thermal conductivity of at least about 10 W/m/K.

In embodiments, the thermally conductive material may comprise of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the thermally conductive material may comprise or consist of aluminum oxide.

Heatsinks are known in the art. The term "heatsink" (or heatsink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heatsink is especially designed to maximize its surface area in contact with the fluid cooling medium surrounding it. Hence, especially a heatsink may comprise a plurality of fins. For instance, the heatsink may be a body with a plurality of fins extending thereof.

A heatsink especially comprises (more especially consists of) a thermally conductive material. The term "heatsink" may also refer to a plurality of (different) heatsinks.

Hence, in embodiments the light generating system may further comprise a thermally conductive element, such as a heatsink, wherein the luminescent body is at least partly enclosed by the thermally conductive element, such as the heatsink, and wherein the luminescent body is thermally coupled with the thermally conductive element, such as the heatsink; wherein one or more of the following applies: (i) the thermally conductive element, such as the heatsink is reflective for the luminescent material light, and (ii) a reflector configured between the luminescent body and the thermally conductive element, such as the heatsink is reflective for the luminescent material light. Hence, in embodiments the cavity wall may be defined by one or more of (i) a thermally conductive element, such as a heatsink which is reflective for the luminescent material light, and (ii) a reflector configured between the luminescent body and a thermally conductive element, such as a heatsink. For instance, an aluminum heatsink may be sufficiently reflective for the luminescent material light. Therefore, in specific embodiments the heatsink and the first optics may define the cavity. The reflector may in embodiments be a reflective coating, such as a coating of one or more of $TiO_2$, $BaSO_4$, or $Al_2O_3$, or other materials known to a person skilled in the art.

In embodiments, the luminescent body may be thermally coupled with the thermally conductive element, such as heatsink, but may not be optically coupled.

When elements are in optical contact or optically coupled, they may in embodiments be in physical contact with each other or may in other embodiments be separated from each other with e.g. a (thin) layer of optical material, such as an optical glue, or other optically transparent interface material, e.g. having a thickness of less than about 1 mm, preferably less than 100 μm. When no optically transparent interface material is applied, the (average) distance between two elements being in optical contact may especially be about at maximum the wavelength of relevance, such as the wavelength of an emission maximum. For visible wavelengths, this may be less than 1 μm, such as less than 0.7 μm, and for blue even smaller. Hence, when optical coupling is desired, an optically transparent interface material may be applied. In yet other embodiments, when no optically transparent interface material is applied, the average distance between two elements being in optical contact may especially be about at maximum the wavelength of relevance, such as the wavelength of an emission maximum. Hence, when optical contact is desired, there may be physical contact. However, even in such embodiments there may be a non-zero average distance, but then equal to or lower than the wavelength of interest, such as a centroid wavelength of the laser radiation.

In specific embodiments, the heatsink may comprise the cavity opening.

The first optics may in embodiments comprise a dichroic element.

Alternatively or additionally, the first optics comprise a (reflective) polarization filter, wherein the device light is polarized device light, and wherein the polarization filter and the light generating device are configured such that at least part of the polarized device light is transmitted by the polarization filter and at least part of the luminescent material light is reflected by the polarization filter. The device light may in embodiments comprise polarized laser light. In embodiments, the polarization filter may be a reflective polarization filter. Instead of the term "polarization filter" also the term "polarizer" may be applied.

In embodiments, wherein the first optics comprise a polarization filter, two oppositely arranged light generating devices, especially lasers, may be configured to generate device light having a polarization, wherein the light generating devices and the polarization filter are configured such that at least part of the device light is transmitted through the polarization filter.

In embodiments, the polarization filter may comprise two or more different polarization filters, or two or more different polarization domains. In such embodiments, different light generating devices, such as lasers, may be configured to provide the device light for at least 50% to a specific polarization filter or polarization domain. In embodiments, n1 lasers may be provided under 360/n angle with respect to each other. In specific embodiments, n1 may be 4. Two or more of the n1 lasers may provide device light having different polarizations. For instance, one or more of the n1 lasers may provide device light with a p polarization and one or more other of the n1 lasers may provide device light with a s polarization. For instance, when n1=4, in embodiments two lasers may provide device light with a p polarization and lasers may provide device light with a p polarization.

In embodiments, the device light may be provided to the first optics under an angle, instead of under perpendicular radiation. Combinations, however, may also be applied. Hence, in specific embodiments the light generating system may comprise n1 light generating devices configured to generate the device light with optical axes (O) under an angle α with the primary optic surface, wherein the angle α is at least 40° and smaller than 90°. Especially, in embodiments a may be selected from the range of 50-80°. Further, in embodiments $n1 \geq 1$. In specific embodiments, $n1 \geq 2$, such as $3 \leq n1 \leq 12$, like $4 \leq n1 \leq 8$. However, more light generating device may also be possible.

The system may provide during operation system light. In an operational mode, the system light may at least comprise luminescent material light. To this light, other light may be admixed. This may be done downstream of the luminescent body. However, together with the luminescent material light, also device light may propagate away from the luminescent body, e.g. due to reflection at the first optics and/or due to reflection within the cavity and escape via the cavity opening (and/or first optics).

Hence, in specific embodiments, the light generating system may be configured to generate system light (wherein the luminescent material is configured to convert part of the device light into luminescent material light), and wherein during operation at least part of the device light escapes from the cavity via the cavity opening, wherein the system light comprises device light and luminescent material light.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

In embodiments, the light generating device may be configured to generate device light having a first centroid wavelength $\lambda 1$, for instance in the blue, and the luminescent material light may have a second centroid wavelength $\lambda 2$, for instance in the green, yellow, orange or red, wherein $\lambda 2 - \lambda 1 \geq 50$ nm. In embodiments, 50 nm $\leq \lambda 2 - \lambda 1 \leq 250$ nm, such as 50 nm $\leq \lambda 2 - \lambda 1 \leq 200$ nm. In embodiments, $\lambda 2 - \lambda 1 \geq 70$ nm, especially $\lambda 2 - \lambda 1 \geq 90$ nm, such as at least 100 nm, like at least 110 nm difference.

In embodiments, the luminescent body may comprise a ceramic body.

Further embodiments and aspects are described below.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

The luminescent material layer may also comprise a plurality of different luminescent materials. The term "layer" may also refer to multi-layer. Especially, the luminescent material layer comprises a ceramic body. The term "ceramic body" may in specific embodiments also refer to a plurality of ceramic bodies. Hence, in embodiments the luminescent material layer may comprise a ceramic body comprising the luminescent material. Yet further, in specific embodiments the luminescent material comprises a luminescent material of the type $A_3B_5O_{12}$:Ce, wherein A comprises one or more of Y, La, Gd, Tb and Lu, and wherein B comprises one or more of Al, Ga, In and Sc. Examples of luminescent materials are described below.

As indicated above, the light generating system is configured to generate in an operational mode system light at least comprising the luminescent material radiation. The system light may also comprise unabsorbed device light, unless filtered away, or unless there is no unabsorbed device light (in the case of full conversion). Further, other light generating devices than described herein may be available, which generate light that may be comprised by the system light in the operational mode. Yet further, it may also be possible that a plurality of light generating devices is available, having different spectral power distributions of the device light, optionally with accompanying optics, that comply with the same principle as described herein. Hence, the term "system" may in embodiments relate to a plurality of systems, and may in specific embodiments relate to a plurality of systems that may share one or more elements, such as one or more optics. Especially, such plurality of system that may share one or more elements, may at least share a radiation exit window, like an end window of light transmissive (solid) material or an opening in a housing.

Especially, in embodiments the device radiation may comprise one or more of UV and visible radiation. In specific embodiments, the device radiation is essentially visible radiation, like blue light. Especially, in embodiments the luminescent material radiation may comprise one or more of visible radiation and IR radiation. In specific embodiments, the luminescent material radiation is essentially visible radiation, like yellow and/or red light, with optionally at maximum 20%, such as at maximum 10% of the power of the spectral power distribution of the luminescent material radiation at wavelengths beyond 780 nm.

In embodiments, system may be configured to generate white light in the operational mode. This is further elucidated below.

In embodiments the luminescent body and the light generating device may be configured in the reflective mode. In other embodiments, the luminescent body and the light generating device may be configured in the transmissive mode.

Further, the system may comprise or be functionally coupled to a control system. The control system may control the light generating device and optionally other devices, such as indicated above.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

The terms "visible", "visible light" or "visible emission" and similar terms refer to light having one or more wavelengths in the range of about 380-780 nm. Herein, UV may especially refer to a wavelength selected from the range of 200-380 nm.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

Hence, in embodiments, the control system may control in dependence of one or more of an input signal of a user interface, a sensor signal (of a sensor), and a timer. The term "timer" may refer to a clock and/or a predetermined time scheme.

As indicated above, the light generating system further comprises a luminescent body. Especially, the luminescent body comprises a luminescent material, wherein the luminescent body is configured in a light receiving relationship with the n laser light sources, wherein the luminescent material is configured to convert at least part of the laser light source light into luminescent material light. Especially, the luminescent material light comprises visible light, such as having a color point in the yellow or green.

The luminescent material is configured to convert at least part of first radiation (selected from one or more of UV radiation and visible radiation), into luminescent material light. Especially, in embodiments the luminescent material may be configured to convert at least part of blue light (as radiation) into luminescent material light. Especially when blue light is partly converted, the blue light may be used as source of blue light (for the device light) and as excitation light that can be converted by the luminescent material. The first radiation may especially be provided by a (solid state) light source, see further below.

When different luminescent materials are applied, one or more luminescent materials may be configured to convert laser light source light into one or more of green and yellow luminescent material light, and one or more other luminescent materials may be configured to convert laser light source light into one or more of orange and red luminescent material light.

In specific embodiments, the luminescent body comprises a ceramic body comprising the luminescent material. Alternatively, the luminescent body comprises single crystal. In yet further specific embodiments, different types of luminescent bodies may be applied. Hence, the body may especially be selected from single crystalline bodies and ceramic bodies. The latter may be more easily made than the former, while they nevertheless may have good optical and/or thermal properties. Hence, in embodiments the body may be a ceramic body. However, in specific embodiments also a combination of single crystalline bodies and ceramic bodies may be applied. Especially, the luminescent body comprises a ceramic luminescent body. Hence, in specific embodiments the luminescent body is defined by a ceramic luminescent material. Therefore, in specific embodiments the luminescent material is a luminescent material that can be provided a ceramic luminescent body. Hence, the luminescent body may comprise a ceramic luminescent body.

Many of the above described luminescent materials, especially the garnet materials, can be provided as ceramics (ceramic body or ceramic slab). At least this applies for the above described $A_3B_5O_{12}$:Ce, or with an alternative formula described $A_3B'_2C''_3O_{12}$:Ce (see also below).

Ceramic bodies are known in the art. Especially, the ceramic material may be obtainable by a sintering process and/or a hot pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of 10' to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of theoretical density. After both the pre-sintering and the heating, especially under elevated pressure, such as HIP, the density of the light transmissive body can be close to the density of a single crystal. However, a difference is that grain boundaries are available in the light transmissive body, as the light transmissive body is polycrystalline. Such grain boundaries can e.g. be detected by optical microscopy or SEM. Hence, herein the light transmissive body especially refers to a sintered polycrystalline having a density substantially identical to a single crystal (of the same material). Such body may thus be highly transparent for visible light (except for the absorption by the light absorbing species such as especially $Ce^{3+}$).

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention also provides a lamp or a luminaire comprising the light generating system as defined herein. The luminaire may further comprise a housing, optical elements, louvres, etc. etc. . . . . . The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. The light generating system may also be used for disinfection or optical wireless communication. Hence, in an aspect the invention also provides a light generating device selected from the group of a lamp, a luminaire, a projector device, a disinfection device, and an optical wireless communication device, comprising the light generating system as defined herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2a-2f schematically depict some embodiments and aspects; and

The schematic drawings are not necessarily to scale.

DETAILED DESCRIPTION OF THE EMBODIMENTS

Laser based light sources are gathering much interest due to their potential in producing extremely high intensities. There are already products such as car head lights and projection television on the market where lasers are used for pumping phosphor.

Ce doped Garnets (e.g. YAG, LuAG) are suitable luminescent convertors which can be used for this purpose as the garnet matrix has the highest chemical stability and temperature quenching occurs only above 200° C. at Ce concentrations below 0.5%. For this purpose, phosphor ceramics with a size ranging from to 0.04 mm×(0.2 mm*0.2 mm) to 16 mm×(4 mm*4 mm) can be used.

In the case of the reflective mode blue laser light is incident on a phosphor realizing almost full conversion of blue light leads to emission of converted light. It is for this reason that use of garnet phosphors with relatively high stability and thermal conductivity is suggested. However, heat management remains to be an issue when extremely high-power densities are used.

In order to get high brightness, it may be useful to use a phosphor tile which is as small as possible. However, when the size decreases the brightness is limited by thermal quenching. Furthermore, when the size decreases it is difficult to pump the phosphor tile and leads to complex and costly laser-phosphor architectures.

Amongst others, here, placing a phosphor on a highly reflective heatsink and arranging a dichroic reflector for yellow/green (and optionally red) light on the other side is proposed. The phosphor can be irradiated at a top surface through the dichroic mirror by (multiple) lasers. In embodiments, the dichroic reflector has a (central) physical emission hole for deliberate escape of the phosphor emission via such hole. In embodiments, the radiation at a top surface, is preferably close to the edge, at e.g. multiple points. The phosphor may in embodiments be a (ceramic) (poly crystal/single crystal) (disc like) tile (which sides may also be arranged in the heatsink). The ratio of the surface area of the emission hole (A2) and area of the top surface (A1) may in embodiments be in the range from 0.05 to 0.3. The phosphor tile may be (conically) shaped to obtained light directionality in the converter.

Figure 1A:
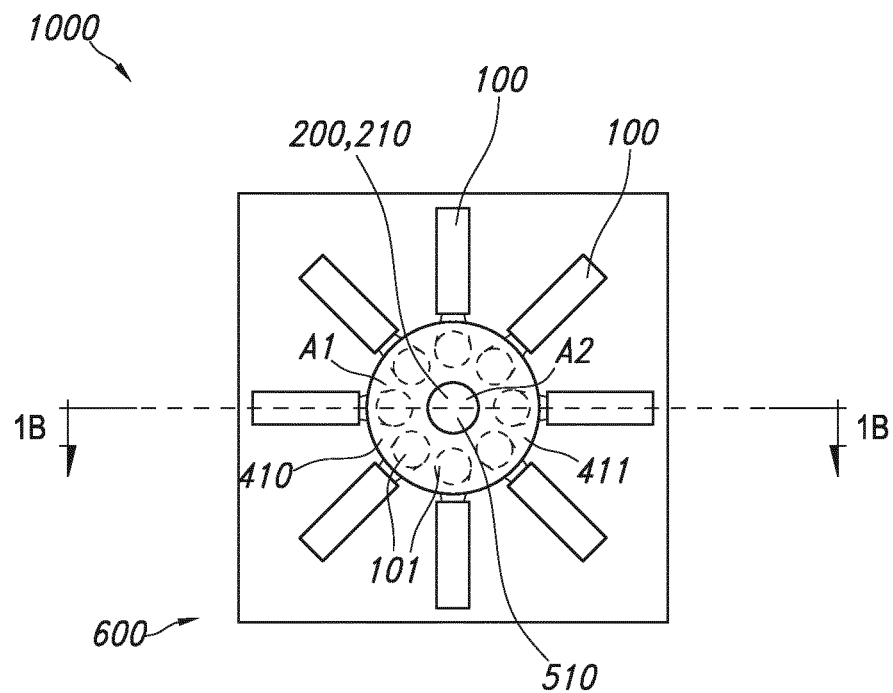
FIGS. 1a-1b schematically depicts an embodiments and variations.
Figure 1B:
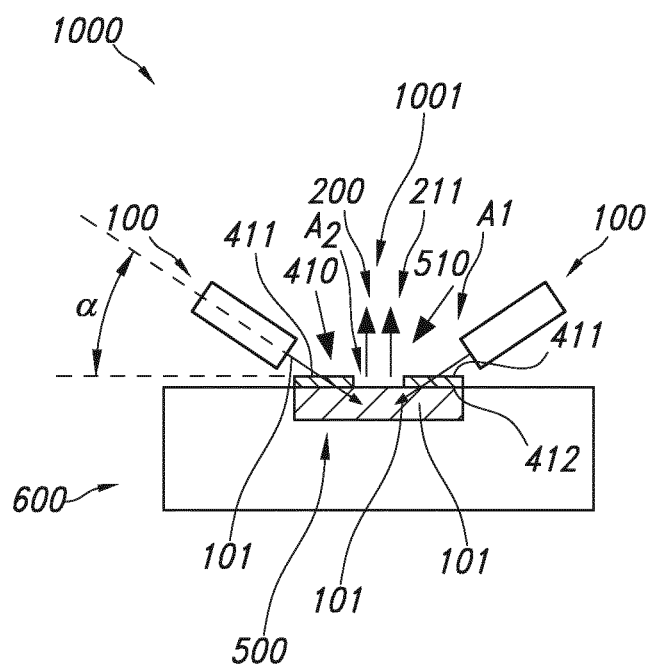

FIGS. 1a-1b schematically depict an embodiment of a light generating system 1000 comprising a light generating device 100, a luminescent body 200, and first optics 410.

The light generating device 100 is configured to generate device light 101. In specific embodiments, the light generating device 100 comprises a laser or is a laser. Hence, in embodiments device light 101 may be laser light. FIG. 1 schematically depicts an embodiment with n1=8 light generating devices. In embodiments, the radiation at a top surface may especially be close to the edge, at e.g. multiple points. Referring to e.g. FIGS. 1a-1b, the system 1000 may thus comprise n1 light generating devices 100 configured to generate the device light 101 with optical axes O under an angle α with the primary optic surface 411. In embodiments, the angle α is at least 40° and smaller than 90°. Especially, a may be selected from the range of 50-80°. Further, in specific embodiments n1≥2. However, n1 may also be 1.

The system 1000 further comprises a luminescent body 200, which comprises a luminescent material 210. Approximately the same area as indicated with the larger circle may be a cylindrical luminescent body 200, of which only the middle part is visible (see further below).

The luminescent material 210 is configured to convert at least part of the device light 101 into luminescent material light 211. Especially, the luminescent body 200 is transmissive for at least part of the luminescent material light 211.

Reference 410 refers to first optics. As seen from above, in this embodiment the first optics 410 cover a (substantial) part of the luminescent body 200. Hence, unless when the first optics 410 are transmissive for the device light 101, such light may not reach, or only reach with reduced intensity, the luminescent body 200 via the first optics.

FIG. 1a shows schematically (eight) spots of device light 101 on the primary face 411 of the first optics 410.

In embodiments, the light generating device 100 and optional second optics (see below) may be configured to irradiate at least 50% of the first surface area A1 with the device light 101.

Further, in embodiments the light generating system 1000 may be configured such that at least 60% of the device light 101 entering the luminescent body 200 enters the luminescent body 200 after transmission through the first optics 410. In embodiments, part of the device light 101 may also enter via the cavity opening 510, such as e.g. at maximum about 40% of the device light 101 that reaches the luminescent body 200.

As seen in FIG. 1b, the device light 101 may have an optical axis which intercepts the first optics. Hence, no device light 101 are only a part of the device light 101 may directly reach the luminescent body via a cavity opening 510 (see further below).

Especially, the first optics 410 are transmissive for at least part of the device light 101 and reflective for at least part of the luminescent material light 211.

The first optics 410 comprise a primary optic surface 411 directed away from the luminescent body 200 and a secondary optic surface 412 directed to the luminescent body 200. The primary optic surface 411 has a first surface area A1. As schematically depicted in FIG. 1a-1b, the primary optic surface 411 may be configured in a light receiving relationship with the light generating device 100.

Note that in this embodiment, the first optics 410 and the cavity opening 510 may essentially have the same shape (here round).

As schematically depicted, the luminescent body 200 is enclosed by a cavity 500 having the cavity opening 510. The cavity opening has a smallest cross-sectional area A2. Note that in these schematically depicted embodiments the cavity 500 is at least partly defined by the optics 410. Further, as schematically depicted A2<A1. In specific embodiments, $0.05 \leq A2/A1 \leq 0.3$.

In the schematically depicted embodiment, the first optics 410 comprise the cavity opening 510.

In embodiments, the first optics 410 comprise a dichroic element. In alternative embodiments the first optics 410 may comprise a reflective polarization filter, wherein the device light 101 is polarized device light 101, and wherein the polarization filter and the light generating device 100 are configured such that at least part of the polarized device light 101 is transmitted by the polarization filter and at least part of the luminescent material light 211 is reflected by the polarization filter.

Reference 1001 indicates the system light of the system 1000, which may comprise the luminescent material light 211.

Hence, the light generating system 1000 is especially configured to generate system light 1001, wherein the luminescent material 210 is configured to convert part of the device light 101, and wherein during operation at least part of the device light 101 escapes from the cavity 500 via the cavity opening 510, wherein the system light 1001 comprises luminescent material light 211 and optionally device light 101.

Reference 600 refers to a heatsink or other thermally conductive element. Note that in this embodiment the heatsink (or other thermally conductive element) 600 defines at least part of the cavity 500. The heatsink (or other thermally conductive element) may be at least partially reflective for the luminescent material light 211 (and the device light (101)).

Referring to the embodiments in FIGS. 2a-2b, angle α may also be 90°. In such embodiment, third optics 430, especially dichroics, may be applied, which may transmit or reflect the device radiation 101 and which may reflect or transmit luminescent material radiation 211, see embodiments I and II in FIG. 2a. However, embodiment I in FIG. 2b also shows that a simple reflector, indicated as third optics 430 in this embodiment, may be applied.

The embodiment II in FIG. 2b show that second optics 420, such as lenses, may be used to control the beam shape of the device light 101.

FIG. 2c shows that also other shapes of the luminescent body 200 may be possible. For instance, the phosphor tile may be (conically) shaped to obtained light directionality in the converter. The dashed area schematically shows the cavity 500 and cavity opening 510, just to illustrate these aspects.

Referring to FIG. 2d, but also to FIGS. 1a-2c, embodiments are schematically depicted wherein the light generating system 1000 comprises the heatsink 600. The luminescent body 200 is at least partly enclosed by the heatsink 600. Especially, the luminescent body 200 may be thermally coupled with the heatsink 600. Further, embodiments are depicted wherein one or more of the following applies: (i) the heatsink 600 is reflective for the luminescent material light 211 (see FIGS. 1a-2c), and (ii) a reflector 610 configured between the luminescent body 200 and the heatsink 600 is reflective for the luminescent material light 211 (see FIG. 2d). Hence, in embodiments at least part of the reflector 610 may defined the cavity wall of the cavity 500.

Hence, in embodiments the heatsink 600 and the first optics 410 define the cavity 500. In yet other embodiments, the first optics 410 and one or more of the reflector 610 and the heatsink 600 may define the cavity 500.

FIG. 2e schematically depict some alterative embodiments, wherein embodiment I appears to have more than one cavity openings 510, which in the case of a ring shaped cavity opening 510 be one and the same opening. Embodiment I of FIG. 2e shows that A1 may be defined by several parts (outer ring and inner ring, e.g.), and A2 may be defined by e.g. a ring shaped cavity opening 510 (or a plurality of cavity openings).

Embodiment II of FIG. 2e schematically depicts an embodiments wherein the heatsink 600 comprises the cavity opening 510.

Figure 2F:
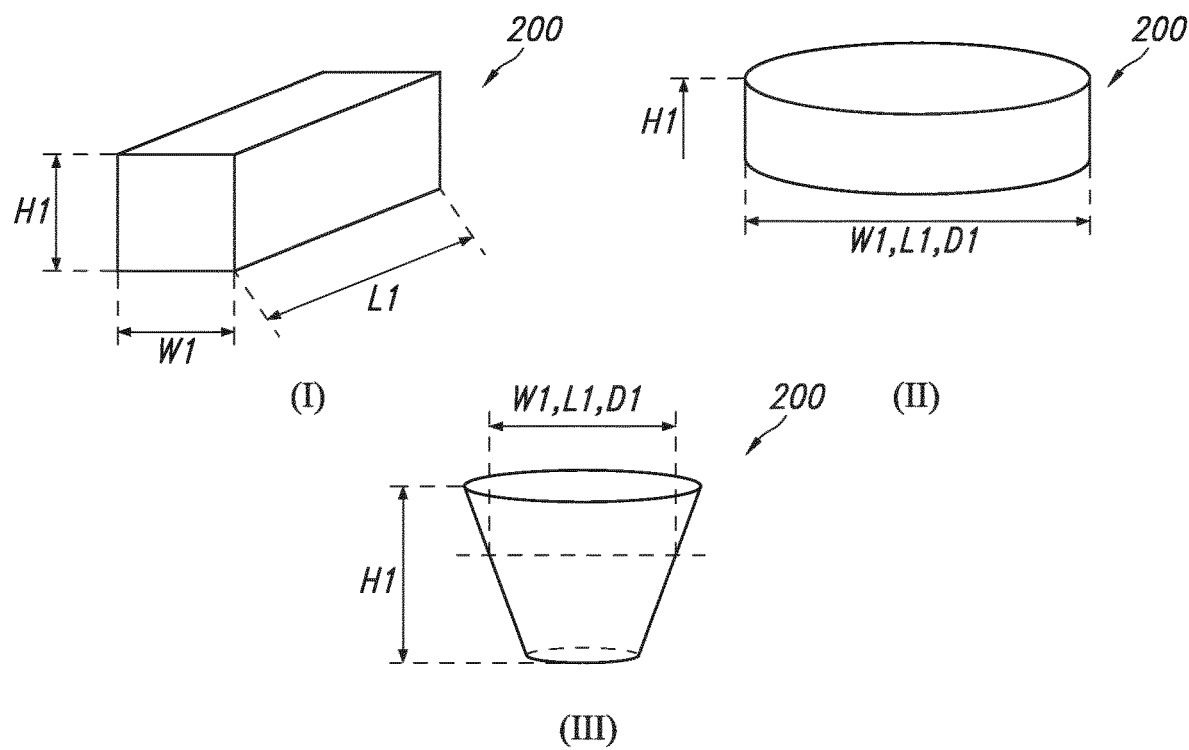

FIG. 2f schematically depict some embodiments of shapes of luminescent bodies 200. The luminescent body 200 may have a first length L1, a first height H1, and a first width W1. Especially, $H1 \leq 0.5*L1$ and $H1 \leq 0.5*W1$. Note that in the case of a circular cross-section W1=L1=D1 (diameter). When the length, width or diameter varies over the height H1 (see embodiment III), an average value, averaged over the height H1 may be applied.

In embodiments, the light generating device 100 is configured to generate device light 101 having a first centroid wavelength $\lambda 1$, and wherein the luminescent material light 211 has a second centroid wavelength $\lambda 2$, wherein $\lambda 2 - \lambda 1 \geq 50$ nm. Further, in embodiments the luminescent material 210 comprises a luminescent material of the type $A_3B_5O_{12}$:Ce, wherein A comprises one or more of Y, La, Gd, Tb and Lu, and wherein B comprises one or more of Al, Ga, In and Sc.

Figure 3:
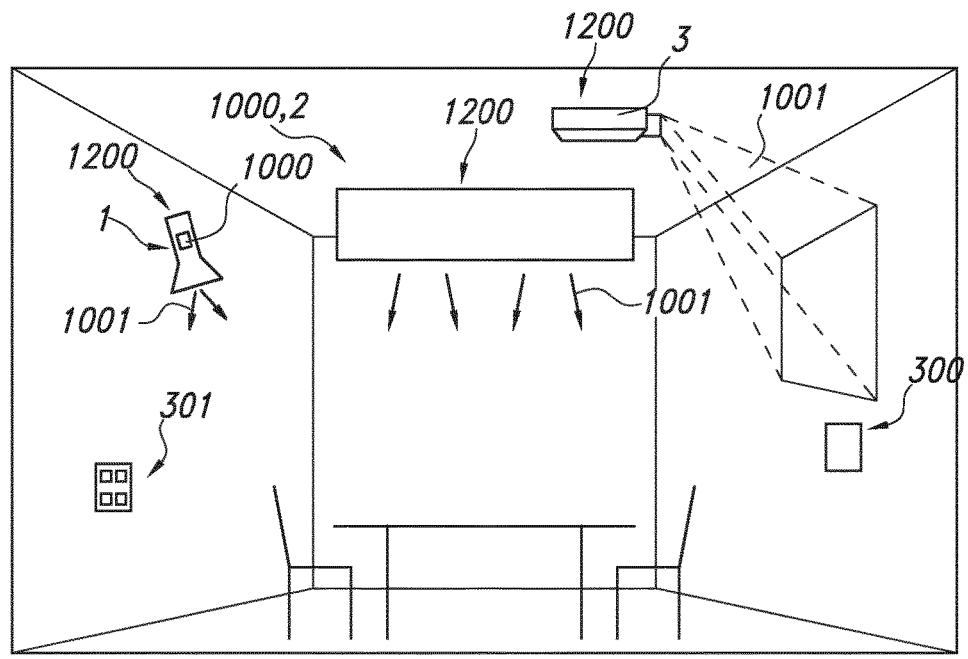
FIG. 3 shows some applications.

FIG. 3 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 3 also schematically depicts an embodiment of lamp 1 comprising the light generating system 1000. Reference 3 indicates a projector device or projector system, which may be used to project images, such as at a wall, which may also comprise the light generating system 1000.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The invention claimed is:

1. A light generating system comprising a light generating device, a luminescent body, a heatsink and first optics, wherein:
   the light generating device is configured to generate device light; wherein the light generating device comprises a laser;
   the luminescent body comprises a luminescent material, wherein the luminescent material is configured to convert at least part of the device light into luminescent material light, and wherein the luminescent body is transmissive for at least part of the luminescent material light;
   the first optics are transmissive for at least part of the device light and reflective for at least part of the luminescent material light, wherein the first optics comprise a primary optic surface having a first surface area A1, wherein the primary optic surface is configured in a light receiving relationship with the light generating device;
   the luminescent body is at least partly enclosed by the heatsink, and wherein the luminescent body is thermally coupled with the heatsink
   the luminescent body is enclosed by a cavity having a cavity opening having a smallest cross-sectional area A2, wherein the cavity is defined by the first optics and the heatsink; wherein the first optics comprises the cavity opening; wherein A2<A1; and
   the cavity being reflective for the luminescent material light and, during operation, at least 70% of the luminescent material light substantially only exiting the cavity via the cavity opening.

2. The light generating system according to claim 1, wherein the light generating device is configured to irradiate at least 50% of the first surface area with the device light.

3. The light generating system according to claim 1, wherein the light generating device further comprises second optics configured to influence the beam shape of the light generating device.

4. The light generating system according to claim 1, wherein the light generating system is configured such that at least 60% of the device light entering the luminescent body enters the luminescent body after transmission through the first optics.

5. The light generating system according to claim 1, wherein the luminescent body is at least partly enclosed by the heatsink, and wherein the luminescent body is thermally coupled with the heatsink; wherein one or more of the following applies: (i) the heatsink is reflective for the luminescent material light, and (ii) a reflector configured between the luminescent body and the heatsink is reflective for the luminescent material light.

6. The light generating system according to claim 1, wherein the first optics comprise a dichroic element.

7. The light generating system according to claim 1, wherein the first optics comprise a reflective polarization filter, wherein the device light is polarized device light, and wherein the polarization filter and the light generating device are configured such that at least part of the polarized device light is transmitted by the polarization filter and at least part of the luminescent material light is reflected by the polarization filter.

8. The light generating system according to claim 1, wherein $0.05 \leq A2/A1 \leq 0.3$.

9. The light generating system according to claim 1, comprising n1 light generating devices configured to generate the device light with optical axes under an angle $\alpha$ with the primary optic surface, wherein the angle $\alpha$ is at least 40° and smaller than 90°, wherein $n1 \geq 2$.

10. The light generating system according to claim 1, wherein the light generating system is configured to generate system light, wherein during operation at least part of the device light escapes from the cavity via the cavity opening, wherein the system light comprises device light and luminescent material light.

11. The light generating system according to claim 1, wherein the light generating device is configured to generate device light having a first centroid wavelength $\lambda 1$, and wherein the luminescent material light has a second centroid wavelength $\lambda 2$, wherein $\lambda 2 - \lambda 1 \geq 50$ nm.

12. The light generating system according to claim 1, wherein the luminescent body comprises a ceramic body, wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc.

13. The light generating system according to claim 1, wherein the luminescent body has a first length L1, a first height H1, and a first width W1, wherein $H1 \leq 0.5*L1$ and $H1 \leq 0.5*W1$.

14. The light generating system according to claim 1, wherein the heatsink comprises the cavity opening.

15. A light generating device selected from the group of a lamp, a luminaire, a projector device, a disinfection device, and an optical wireless communication device, comprising the light generating system according to claim 1.

* * * * *